US006861907B2

United States Patent
Gotou (10) Patent No.: US 6,861,907 B2
(45) Date of Patent: Mar. 1, 2005

(54) POWER AMPLIFIER (75) Inventor: Seiki Gotou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/654,953

(22) Filed: Sep. 5, 2003

(65) Prior Publication Data
US 2004/0056723 A1 Mar. 25, 2004

(30) Foreign Application Priority Data
Sep. 24, 2002 (JP) .................................. 2002-277452

(51) Int. Cl.[7] .............................................. H03F 3/68
(52) U.S. Cl. ..................................... 330/295; 330/286
(58) Field of Search ................................ 330/295, 286, 330/124 R, 302, 296, 285, 53

(56) References Cited

U.S. PATENT DOCUMENTS

| 5,420,541 | A | 5/1995 | Upton et al. | |
| 5,886,575 | A | 3/1999 | Long | |
| 6,320,462 | B1 * | 11/2001 | Alley | 330/124 R |
| 6,469,581 | B1 * | 10/2002 | Kobayashi | 330/295 |
| 6,617,929 | B2 * | 9/2003 | Kim et al. | 330/295 |

OTHER PUBLICATIONS

W. H. Doherty, "A New High Efficiency Power Amplifier For Modulated Waves", *Proceedings of the Institute of Radio Engineers*, Sep. 1936, pp. 1163–1182, 24(9), Bell Telephone Lab., Inc. New Jersey.

* cited by examiner

*Primary Examiner*—Henry Choe
(74) *Attorney, Agent, or Firm*—Leydig, Voit & Mayer, Ltd.

(57) ABSTRACT

A power amplifier includes a first amplifier acting as an inverse Class F amplifier and having a first transistor and a first two-tenuinal network, a second amplifier acting as a Class F amplifier and having a second transistor and a second two-terminal network, a power distribution circuit for distributing an input signal to the first transistor and the second transistor such that a phase difference between signals supplied to the first transistor and the second transistor reaches about 90 degrees, a distributed line for controlling an output load of the first transistor through an impedance transformation based on an operating state of the second transistor, and a bias circuit for biasing the first transistor and the second transistor such that different harmonic processing conditions are set in the first amplifier and the second amplifier.

8 Claims, 7 Drawing Sheets

POWER AMPLIFIER

BACKGROUND OF THE INVENTION

1. (Field of the Invention)

The present invention relates to a power amplifier for use in communication apparatus operating in microwave or milliwave bands in mobile communication, satellite communication, etc.

2. (Description of the Prior Art)

A Doherty amplifier, which forms a basis for the power amplifier of the present invention, was initially proposed by Mr. W. H. Doherty in "A New High Efficiency Power Amplifier For Modulated Waves", Proceedings of the Institute of Radio Engineers, Vol. 24, No. 9, September 1936. This known Doherty amplifier was intended for use in a low-frequency band, such as amplitude modulation (AM) broadcasting. Meanwhile, for example, Japanese Patent No. 2945833 discloses a microwave Doherty amplifier used at microwave band by expanding the concept of the known Doherty amplifier. In this Japanese Patent, two second harmonic tuning networks for controlling harmonic load on signal frequency are, respectively, provided at output sides of transistors of a main amplifier and an auxiliary amplifier. However, the Japanese Patent does not teach that the configuration of the second harmonic tuning network of the main amplifier is different from that of the second harmonic tuning network of the auxiliary amplifier.

Figure 9:
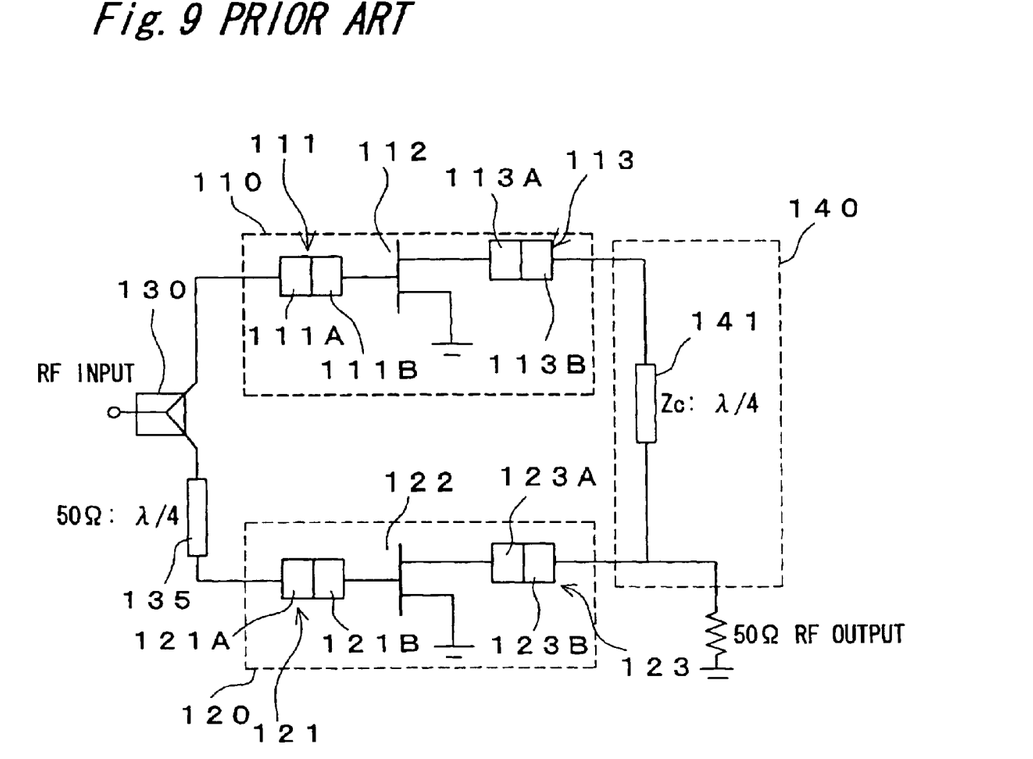
FIG. 9 is a circuit diagram showing a configuration of a prior art high-frequency power amplifier.

FIG. 9 shows a conventional microwave Doherty amplifier. The conventional microwave Doherty amplifier includes a main amplifier 110, an auxiliary amplifier 120, a distribution circuit 130, an electrical input side phase adjusting circuit 135 and a Doherty circuit 140. Supposing that "λ" denotes a wavelength corresponding to a signal frequency, the Doherty circuit 140 includes a (λ/4) Doherty network 141. The main amplifier 110 is formed by a transistor 112, an input circuit 111 for performing fundamental wave matching and harmonic processing of an input of the transistor 112 and an output circuit 113 for performing fundamental wave matching and harmonic processing of an output of the transistor 112. To this end, the input circuit 111 includes an input matching circuit 111A and an inverse Class F harmonic processing circuit 111B, while the output circuit 113 includes an output matching circuit 113A and a harmonic processing circuit 113B. Meanwhile, the auxiliary amplifier 120 is formed by a transistor 122, an input circuit 121 for performing fundamental wave matching and harmonic processing of an input of the transistor 122 and an output circuit 123 for performing fundamental wave matching and harmonic processing of an output of the transistor 122. To this end, the input circuit 121 includes an input matching circuit 121A and a Class F harmonic processing circuit 121B, while the output circuit 123 includes an output matching circuit 123A and a harmonic processing circuit 123B.

In the conventional microwave Doherty amplifier of FIG. 9, since harmonic processing conditions defined by the inverse Class F harmonic processing circuit 111B and the harmonic processing circuit 113B which perform harmonic processing of the main amplifier 110 are identical with those defined by the Class F harmonic processing circuit 121B and the harmonic processing circuit 123B which perform harmonic processing of the auxiliary amplifier 120, both the main amplifier 110 and the auxiliary amplifier 120 operate in Class F. Furthermore, a circuit for setting different harmonic processing conditions in the main amplifier 110 and the auxiliary amplifier 120 is not provided in the conventional microwave Doherty amplifier of FIG. 9.

In the prior art microwave Doherty amplifier of the above Japanese Patent in which the two second harmonic tuning networks having an identical configuration are, respectively, provided at the output sides of the transistors of the main amplifier and the auxiliary amplifier so as to act as harmonic load control circuits and the conventional microwave Doherty amplifier of FIG. 9 in which the main amplifier 110 and the auxiliary amplifier 120 have identical harmonic processing conditions, it is difficult to obtain high-efficiency characteristics.

Thus, through rigid investigations, the present inventor has found that if a configuration of the second harmonic tuning network of the main amplifier is made different from that of the second harmonic tuning network of the auxiliary amplifier in the prior art microwave Doherty amplifier of the Japanese Patent referred to above, it is possible to obtain high-efficiency characteristics. Moreover, the present inventor has confirmed that if different harmonic processing conditions are set in the main amplifier 110 and the auxiliary amplifier 120 of the conventional microwave Doherty amplifier of FIG. 9, higher efficiency can be gained.

SUMMARY OF THE INVENTION

Accordingly, an essential object of the present invention is to provide, with a view to eliminating the above mentioned drawbacks of prior art, a high-frequency power amplifier in which high-efficiency characteristics can be obtained by setting different harmonic processing conditions in a main amplifier and an auxiliary amplifier.

In order to accomplish this object of the present invention, a high-frequency power amplifier according to the present invention includes first and second amplifiers. The first amplifier includes a first transistor, a first two-terminal network, a first input matching circuit and a first output matching circuit, while the second amplifier includes a second transistor, a second two-terminal network, a second input matching circuit and a second output matching circuit. The first two-terminal network is provided at an output side of the first transistor so as to give an open-circuit condition or a sufficiently large load at an even-numbered order harmonic frequency of a signal frequency and give a short-circuiting condition or a sufficiently small load at an odd-numbered order harmonic frequency of the signal frequency, while the second two-terminal network is provided at an output side of the second transistor so as to give the short-circuiting condition or the sufficiently small load at the even-numbered order harmonic frequency of the signal frequency and give the open-circuit condition or the sufficiently large load at the odd-numbered order harmonic frequency of the signal frequency A power distribution circuit is connected between an input of the first amplifier and an input of the second amplifier so as to distribute an input signal to the first transistor and the second transistor. A distributed line is connected between an output of the first amplifier and an output of the second amplifier so as to control an output load of the first transistor through impedance transformation based on an operating state of the second transistor. Furthermore, a bias circuit is provided for the first transistor and the second transistor.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
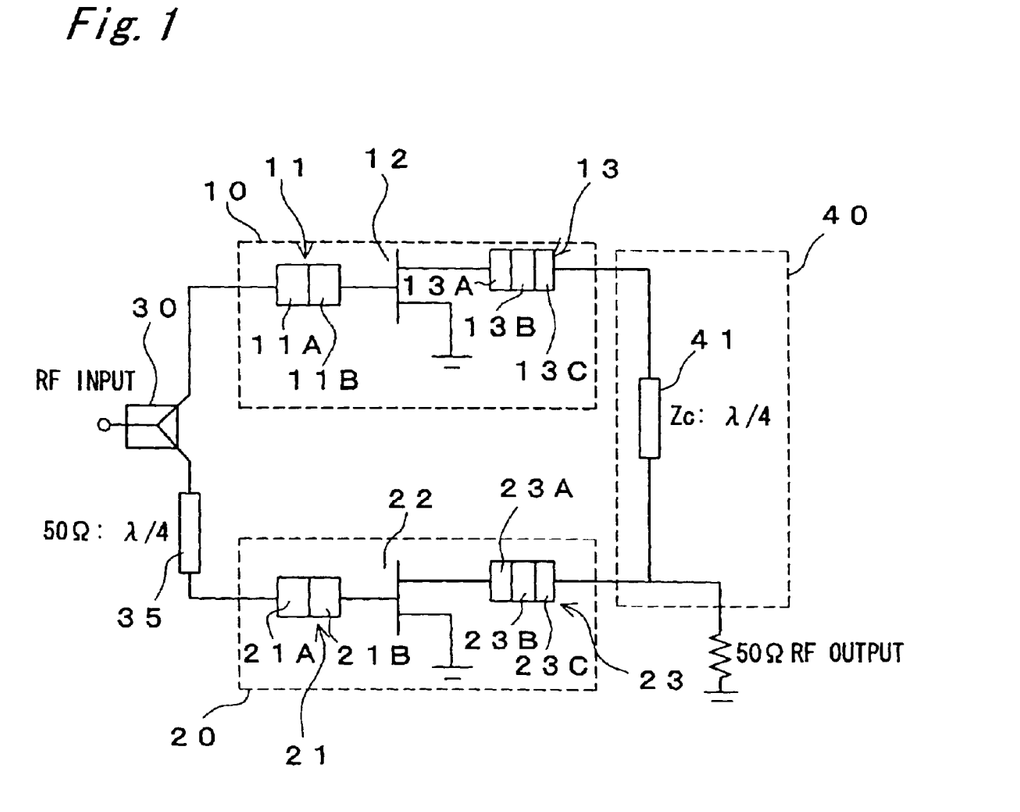
FIG. 1 is a circuit diagram showing a configuration of a high-frequency power amplifier according to a first embodiment of the present invention.

FIG. 1 shows a configuration of a high-frequency power amplifier according to a first embodiment of the present invention. This high-frequency power amplifier includes a main amplifier 10 acting as an inverse Class F amplifier, an auxiliary amplifier 20 acting as a Class F amplifier, a distribution circuit 30, an electrical input side phase adjusting circuit 35 and a Doherty circuit 40. Supposing that "λ" denotes a wavelength corresponding to a signal frequency, the Doherty circuit 40 includes a (λ/4) Doherty network 41. The main amplifier 10 is formed by a transistor 12, an input circuit 11 connected to an input of the transistor 12 and an output circuit 13 connected to an output of the transistor 12. In order to perform inverse Class F operation, the main amplifier 10 is adapted to give an open-circuit condition or a sufficiently large load at an even-numbered order harmonic frequency of the signal frequency and give a short-circuiting condition or a sufficiently small load at an odd-numbered order harmonic frequency of the signal frequency. To this end, an input matching circuit 11A and an inverse Class F harmonic processing circuit 11B are provided in the input circuit 11, while an output matching circuit 13A, an inverse Class F harmonic processing circuit 13B and a harmonic reflector 13C acting as a bias circuit are provided in the output circuit 13.

Meanwhile, the auxiliary amplifier 20 is formed by a transistor 22, an input circuit 21 connected to an input of the transistor 22 and an output circuit 23 connected to an output of the transistor 22. In order to perform Class F operation, the auxiliary amplifier 20 is adapted to give a short-circuiting condition or a sufficiently small load at an even-numbered order harmonic frequency of the signal frequency and give an open-circuit condition or a sufficiently large load at an odd-numbered order harmonic frequency of the signal frequency. To this end, an input matching circuit 21A and a Class F harmonic processing circuit 21B are provided in the input circuit 21, while an output matching circuit 23A, a Class F harmonic processing circuit 23B and a harmonic reflector 23C acting as a bias circuit are provided in the output circuit 23.

The distribution circuit 30, the electrical input side phase adjusting circuit 35, the Doherty circuit 40, the transistor 12 of the main amplifier 10 and the transistor 22 of the auxiliary amplifier 20 in the high-frequency power amplifier of FIG. 1 are similar to those of a conventional high-frequency power amplifier of FIG. 9. The distribution circuit 30 and the electrical input side phase adjusting circuit 35 distribute an input signal to the transistors 12 and 22 such that a phase difference between the transistors 12 and 22 reaches about 90 degrees. Meanwhile, the Doherty network 41 of the Doherty circuit 40 functions as a distributed line for controlling output load of the transistor 12 through impedance transformation based on operating state of the transistor 22.

In ordinary Doherty amplifiers in which a main amplifier and an auxiliary amplifier have different biases so as to operate in Class A to Class AB and in Class C, respectively and are coupled with each other by a Doherty network, output load imparted to the main amplifier is changed for the decrease upon changes of output impedance of the auxiliary amplifier adapted to start drive in the neighborhood of a saturation point such that high linearity and high efficiency at an output level far less than a saturated output point, for example, at the time of a backoff of 5 to 10 dB from the saturated output point are achieved.

In view of the fact that the Doherty amplifier operates by applying different biases to the main amplifier and the auxiliary amplifier, this embodiment is characterized in that the inverse Class F harmonic processing circuits 11B and 13B having high efficiency at an operating point of Class A to Class AB are connected to the transistor 12 of the main amplifier 10, while the Class F harmonic processing circuits 21B and 23B having high efficiency at an operating point of Class C are connected to the transistor 22 of the auxiliary amplifier 20.

Figure 2:
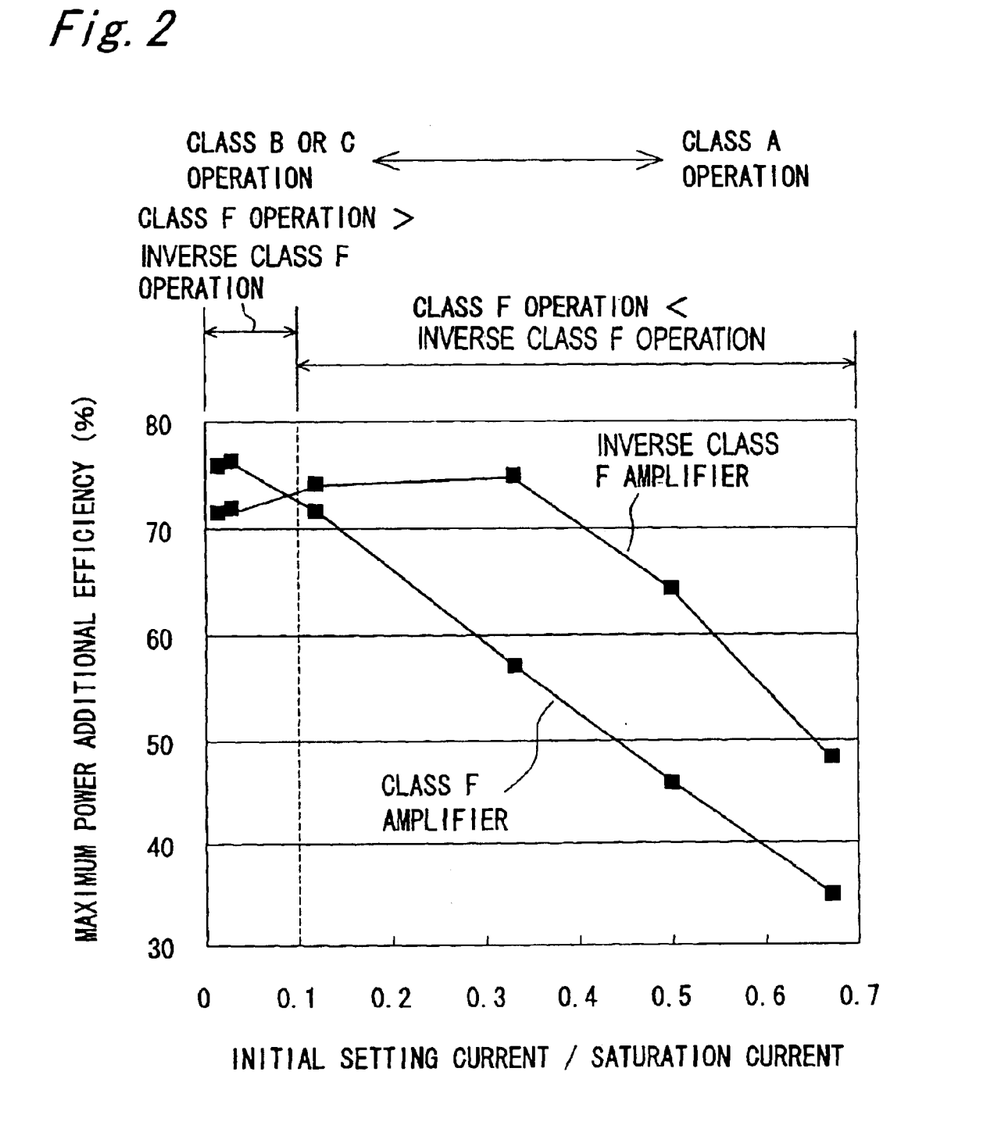
FIG. 2 is a graph showing changes of efficiencies of a Class F amplifier and an inverse Class F amplifier relative to operating point in the high-frequency power amplifier of FIG. 1.

FIG. 2 shows changes of efficiencies of the inverse Class F amplifier 10 and the Class F amplifier 20 and relative to operating point in the high-frequency power amplifier of FIG. 1. It is seen from FIG. 2 that the Class F amplifier 20 has high efficiency at an operating point of Class B to Class C, where initial setting current is small, while the inverse Class F amplifier 10 has high efficiency at an operating point of Class AB to Class A. As a result, it is understood that the inverse Class F amplifier 10 and the Class F amplifier 20 are most suitable as a main amplifier and an auxiliary amplifier of the Doherty amplifier, respectively.

Figure 3:
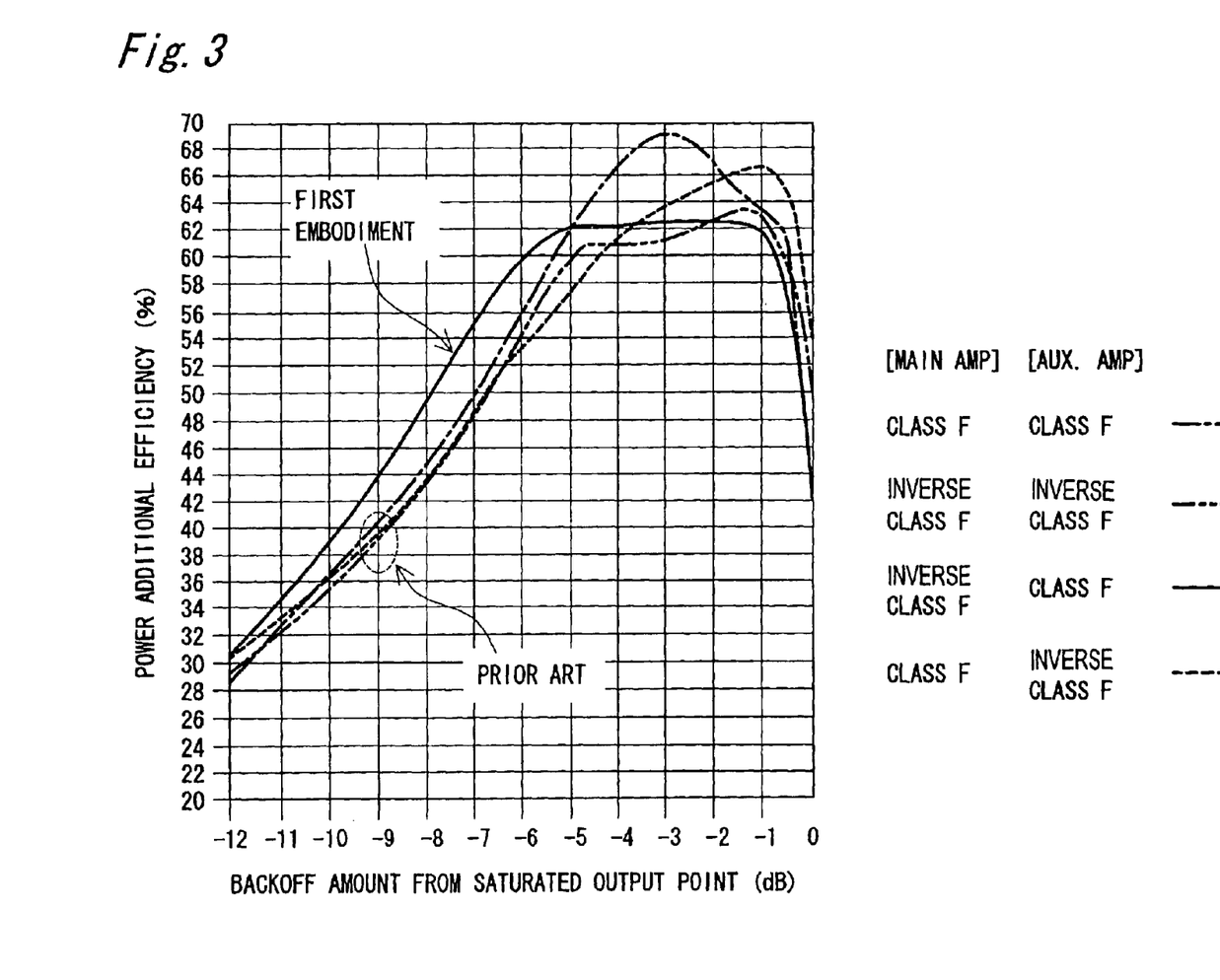
FIG. 3 is a graph showing power additional efficiency of the high-frequency power amplifier of FIG. 1 in comparison with those of conventional high-frequency power amplifiers.

FIG. 3 compares power additional efficiency of the high-frequency power amplifier of FIG. 1 with that of a conventional high-frequency power amplifier by setting harmonic processing conditions of the main amplifier and the auxiliary amplifier to Class F operation or inverse Class F operation. In FIG. 3, the abscissa axis represents backoff amount in dB from the saturated output point. It is apparent from FIG. 3 that the high-frequency power amplifier of FIG. 1 in which the main amplifier 10 and the auxiliary amplifier 20 operate in inverse Class F and Class F, respectively exhibits highest efficiency at a backoff amount of 5 to 12 dB from the saturated output point among combinations of Class F operation and inverse Class F operation and has efficiency higher by 5% than the conventional high-frequency power amplifier in which both the main amplifier and the auxiliary amplifier operate in Class F.

In this embodiment, since the input circuit 11 and the output circuit 13 are connected to the transistor 12 so as to operate the main amplifier 10 in inverse Class F and the input circuit 21 and the output circuit 23 are connected to the transistor 22 so as to operate the auxiliary amplifier 20 in Class F, different harmonic processing conditions are set in the main amplifier 10 and the auxiliary amplifier 20, so that high-frequency characteristics can be obtained.

(Second Embodiment)

Figure 4:
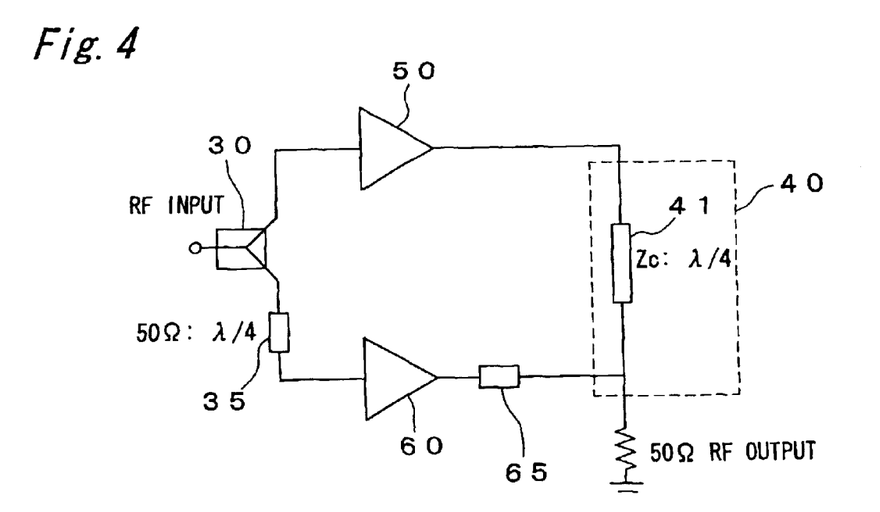
FIG. 4 is a circuit diagram showing a configuration of a high-frequency power amplifier according to a second embodiment of the present invention.

FIG. 4 shows a configuration of a high-frequency power amplifier according to a second embodiment of the present invention. In addition to the distribution circuit 30, the electrical input side phase adjusting circuit 35 and the Doherty circuit 40 of the high-frequency power amplifier of the first embodiment of FIG. 1, this high-frequency power amplifier includes a main amplifier 50 and an auxiliary amplifier 60 in place of the main amplifier 10 and the auxiliary amplifier 20 of the high-frequency power amplifier of FIG. 1. This high-frequency power amplifier further includes a phase adjusting circuit 65 for adjusting phase difference between the main amplifier 50 and the auxiliary amplifier 60.

In the first embodiment, a phenomenon might happen in which characteristics deteriorate at the time of power combination due to phase difference between the main amplifier 10 and the auxiliary amplifier 20 caused by structural difference between the input circuit 11 and the output circuit 13 of the main amplifier 10 on one hand and the input circuit 21 and the output circuit 23 of the auxiliary amplifier 20 on the other hand. Thus, in order to eliminate such a phenomenon, pass phase of the main amplifier 50 is made identical with that of the auxiliary amplifier 60 by the phase adjusting circuit 65 in the high-frequency power amplifier of FIG. 4.

In this embodiment, since phase difference between the main amplifier 50 and the auxiliary amplifier 60 is adjusted by the phase adjusting circuit 65, it is possible to prevent occurrence of the phenomenon in which characteristics deteriorate at the time of power combination due to phase difference between the main amplifier 50 and the auxiliary amplifier 60.

(Third Embodiment)

Figure 5:
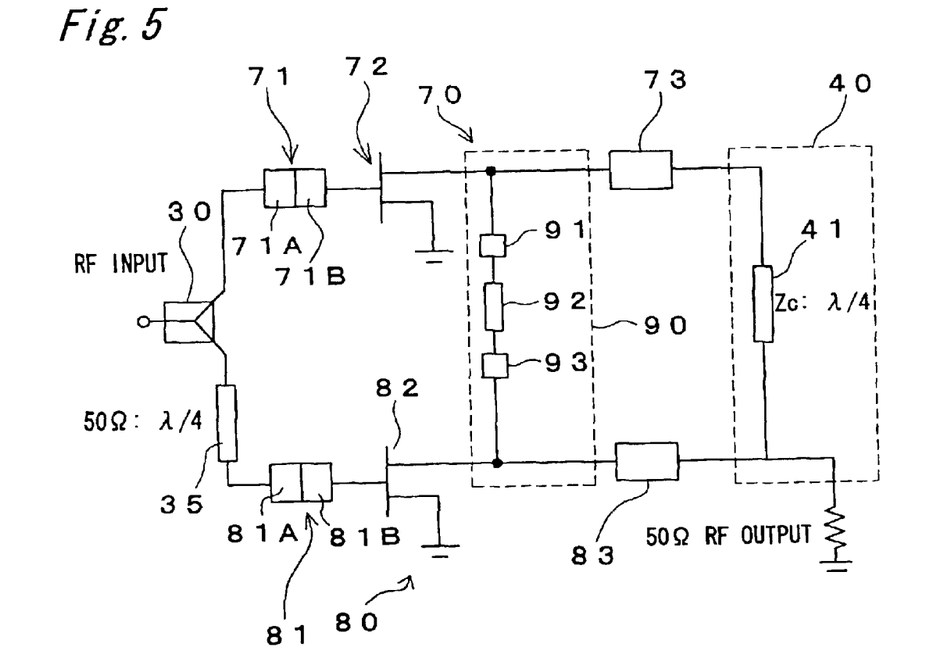
FIG. 5 is a circuit diagram showing a configuration of a high-frequency power amplifier according to a third embodiment of the present invention.

FIG. 5 shows a configuration of a high-frequency power amplifier according to a third embodiment of the present invention. In addition to the distribution circuit 30, the electrical input side phase adjusting circuit 35 and the Doherty circuit 40 of the high-frequency power amplifier of the first embodiment of FIG. 1, this high-frequency power amplifier includes a main amplifier 70 and an auxiliary amplifier 80 in place of the main amplifier 10 and the auxiliary amplifier 20 of the high-frequency power amplifier of FIG. 1.

The main amplifier 70 includes an input circuit 71 having an input matching circuit 71A and an inverse Class F harmonic processing circuit 71B, a transistor 72 and an output fundamental wave matching circuit 73. On the other hand, the auxiliary amplifier 80 includes an input circuit 81 having an input matching circuit 81A and a Class F harmonic processing circuit 81B, a transistor 82 and an output fundamental wave matching circuit 83. In this high-frequency power amplifier, a bypass circuit 90 is further provided between an output terminal of the transistor 72 of the main amplifier 70 and an output terminal of the transistor 82 of the auxiliary amplifier 80 in place of the harmonic reflector 13C acting as the bias circuit for the main amplifier 10 and the harmonic reflector 23C acting as the bias circuit for the auxiliary amplifier 20 in the high-frequency power amplifier of FIG. 1.

The bypass circuit 90 includes N-th harmonic filter circuits 91 and 93 and an N-th harmonic processing circuit 92 provided between the N-th harmonic filter circuits 91 and 93 and having a distributed constant line. In the bypass circuit 90, electrical length of the distributed constant line of the N-th harmonic processing circuit 92 is adjusted such that harmonic loads at the output terminals of the transistor 72 of the main amplifier 70 and the transistor 82 of the auxiliary amplifier 80 are, respectively, set to inverse Class F operation and Class F operation.

Figure 6:
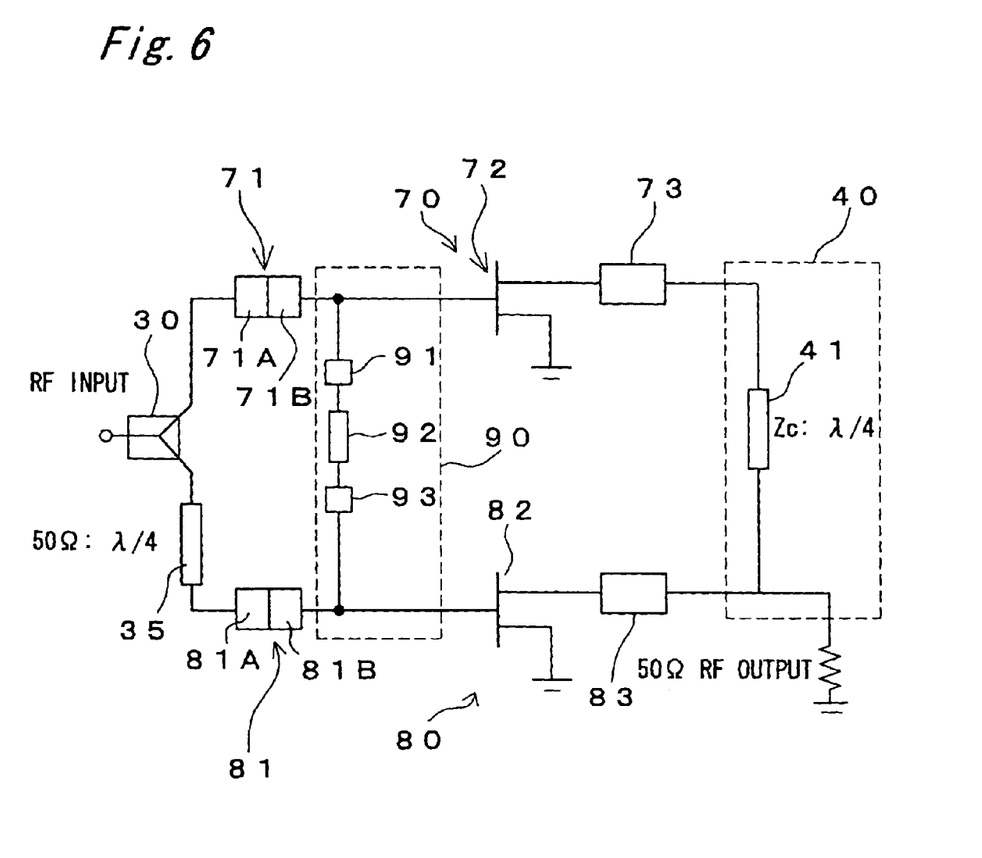
FIG. 6 is a circuit diagram showing a configuration of a modification of the high-frequency power amplifier of FIG. 5.

In the high-frequency power amplifier of FIG. 5, the bypass circuit 90 is provided between the output terminal of the transistor 72 of the main amplifier 70 and the output terminal of the transistor 82 of the auxiliary amplifier 80. However, as illustrated in FIG. 6 showing a modification of the high-frequency power amplifier of FIG. 5, the bypass circuit 90 may also be provided between an input terminal of the transistor 72 of the main amplifier 70 and an input terminal of the transistor 82 of the auxiliary amplifier 80.

In this embodiment, since the bypass circuit 90 is provided between the output terminal of the transistor 72 of the main amplifier 70 and the output terminal of the transistor 82 of the auxiliary amplifier 80 or between the input terminal of the transistor 72 of the main amplifier 70 and the input terminal of the transistor 82 of the auxiliary amplifier 80 in place of the harmonic reflectors 13C and 23C acting as the bias circuits in the main amplifier 10 and the auxiliary amplifier 20 of the high-frequency power amplifier of FIG. 1, respectively, configurations of the main amplifier 70 and the auxiliary amplifier 80 are simplified.

(Fourth Embodiment)

Figure 7:
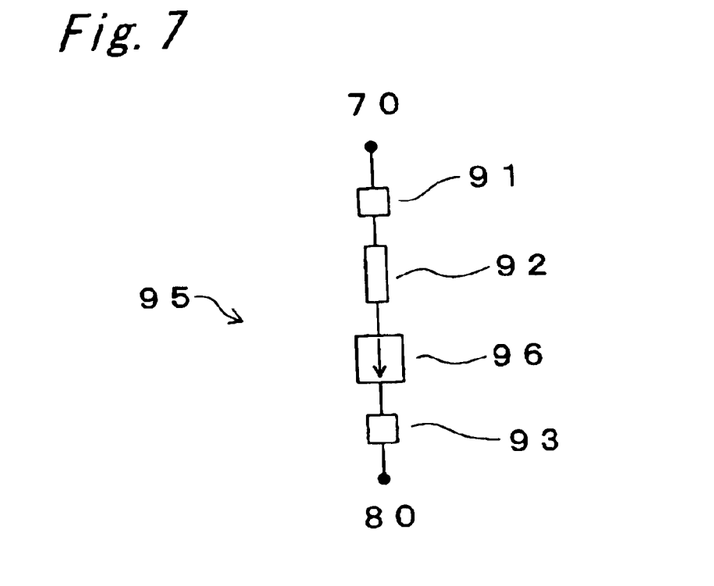
FIG. 7 is a circuit diagram showing a configuration of a bypass circuit employed in a high-frequency power amplifier according to a fourth embodiment of the present invention.

FIG. 7 shows a configuration of a bypass circuit 95 employed in a high-frequency power amplifier according to a fourth embodiment of the present invention. In the bypass circuit 95, an isolator 96 is added between the N-th harmonic processing circuit 92 and the N-th harmonic filter circuit 93 in the bypass circuit 90 of the high-frequency power amplifier of the third embodiment. Since other configurations of this high-frequency power amplifier are similar to those of the high-frequency power amplifier of the third embodiment, the description is abbreviated for the sake of brevity.

The isolator 96 propagates higher harmonic wave in a unilateral direction from the main amplifier 70 to the auxiliary amplifier 80 or from the auxiliary amplifier 80 to the main amplifier 70.

In this embodiment, since the isolator 96 propagates higher harmonic wave in the unilateral direction from the main amplifier 70 to the auxiliary amplifier 80 or from the auxiliary amplifier 80 to the main amplifier 70, adjustment of the harmonic loads at the output terminals or the input terminals of the transistor 72 of the main amplifier 70 and the transistor 82 of the auxiliary amplifier 80 is facilitated.

(Fifth Embodiment)

Figure 8:
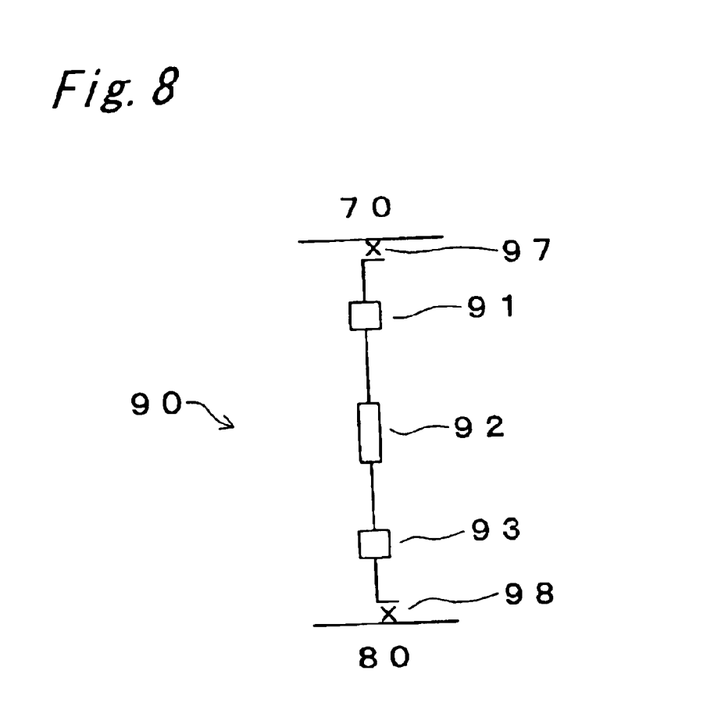
FIG. 8 is a circuit diagram showing a configuration of vicinity of a bypass circuit employed in a high-frequency power amplifier according to a fifth embodiment of the present invention.

FIG. 8 shows a configuration of vicinity of the bypass circuit 90 employed in a high-frequency power amplifier according to a fifth embodiment of the present invention. In this high-frequency power amplifier, the bypass circuit 90 of the high-frequency power amplifier of the third embodiment is connected to the main amplifier 70 and the auxiliary amplifier 80 via directional couplers 97 and 98, respectively. Since other configurations of this high-frequency power amplifier are similar to those of the high-frequency power amplifier of the third embodiment, the description is abbreviated for the sake of brevity.

Each of the directional couplers 97 and 98 carries in a unilateral direction higher harmonic wave outputted from each of the main amplifier 70 and the auxiliary amplifier 80.

In this embodiment, since each of the directional couplers 97 and 98 delivers in the unilateral direction higher harmonic wave outputted from each of the main amplifier 70 and the auxiliary amplifier 80, adjustment of the harmonic loads at the output terminals or the input terminals of the transistor 72 of the main amplifier 70 and the transistor 82 of the auxiliary amplifier 80 is facilitated.

As is clear from the foregoing description, since the high-frequency power amplifier of the present invention includes the first amplifier having the first transistor and the first two-terminal network provided at the output side of the first transistor, the second amplifier having the second transistor and the second two-terminal network provided at the output side of the second transistor, the power distribution circuit for distributing the input signal to the first transistor and the second transistor such that the phase difference between the first transistor and the second transistor reaches about 90 degrees, which is connected between the input of the first amplifier and the input of the second amplifier, the distributed line for controlling the output load of the first transistor through impedance transformation based on the operating state of the second transistor, which is connected between the output of the first amplifier and the output of the second amplifier and the bias circuit which is provided for the first transistor and the second transistor, different harmonic processing conditions are set in the first amplifier and the second amplifier acting as the main amplifier the auxiliary amplifier, respectively, so that high-efficiency characteristics can be obtained.

What is claimed is:

1. A power amplifier comprising:
    a first amplifier including
        a first transistor for signal amplification,
        a first two-terminal network for giving an open-circuit condition or a sufficiently large load to an even-numbered harmonic frequency of a signal frequency and giving a short-circuiting condition or a sufficiently small load to an odd-numbered harmonic frequency of the signal frequency, and which is provided at an output side of the first transistor,
        a first input matching circuit for impedance matching the signal frequency, and which is provided at an input side of the first transistor, and
        a first output matching circuit for impedance matching the signal frequency, and which is provided at the output side of the first transistor;
    a second amplifier including
        a second transistor for signal amplification,
        a second two-terminal network for giving the short-circuiting condition or the sufficiently small load to the even-numbered harmonic frequency of the signal frequency and giving the open-circuit condition or the sufficiently large load to the odd-numbered harmonic frequency of the signal frequency, and which is provided at an output side of the second transistor,
        a second input matching circuit for impedance matching the signal frequency, and which is provided at an input side of the second transistors and
        a second output matching circuit for impedance matching the signal frequency, and which is provided at the output side of the second transistor;
    a power distribution circuit for distributing an input signal to the first transistor and the second transistor such that a phase difference between signals supplied to the first transistor and the second transistor reaches about 90 degrees, and which is connected between an input of the first amplifier and an input of the second amplifier;
    a distributed line for controlling an output load of the first transistor through an impedance transformation based on an operating state of the second transistor, and which is connected between an output of the first amplifier and an output of the second amplifier; and
    a bias circuit for biasing the first transistor and the second transistor.

2. The power amplifier according to claim 1, further comprising, a phase adjusting circuit for adjusting a phase difference between the signals supplied to the first amplifier and to the second amplifier.

3. The power amplifier according to claim 1, wherein the bias circuit is provided between an output terminal of the first transistor and an output terminal of the second transistor and includes a filter for passing only a harmonic band frequency in the signal frequency between the output terminal of the first transistor and the output terminal of the second transistor, and a harmonic processing circuit for processing a higher harmonic wave generated in the first transistor and the second transistor.

4. The power amplifier according to claim 1, wherein the bias circuit is provided between an input terminal of the first transistor and an input terminal of the second transistor and includes a filter for passing only a harmonic band frequency in the signal frequency between the input terminal of the first transistor and the input terminal of the second transistor, and a harmonic processing circuit for processing a higher harmonic wave generated in the first transistor and the second transistor.

5. The power amplifier according to claim 3, wherein the bias circuit further includes an isolator.

6. The power amplifier according to claim 4, wherein the bias circuit further includes an isolator.

7. The power amplifier according to claim 3, further comprising:
    a first directional coupler which is provided at a junction of the bias circuit and the first transistor; and
    a second directional coupler which is provided at a junction of the bias circuit and the second transistor.

8. The power amplifier according to claim 4, further comprising:
    a first directional coupler which is provided at a junction of the bias circuit and the first transistor; and
    a second directional coupler which is provided at a junction of the bias circuit and the second transistor.

* * * * *